United States Patent
Jones

(10) Patent No.: US 8,649,834 B1
(45) Date of Patent: Feb. 11, 2014

(54) LAYERED SUPERCONDUCTOR DEVICE AND METHOD

(75) Inventor: Thomas O. Jones, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/613,244

(22) Filed: Sep. 13, 2012

Related U.S. Application Data

(62) Division of application No. 12/369,218, filed on Feb. 11, 2009, now abandoned.

(51) Int. Cl.
*H01L 39/22* (2006.01)
*H01L 39/24* (2006.01)
*H01L 29/00* (2006.01)

(52) U.S. Cl.
USPC ............. 505/191; 505/190; 505/220; 427/62; 427/63

(58) Field of Classification Search
USPC ................ 505/220, 234, 237, 470, 473, 862; 427/62, 63, 96.1, 98.4, 259, 510; 174/125.1, 250
See application file for complete search history.

(56) References Cited

U.S. PATENT DOCUMENTS 4,954,480 A * 9/1990 Imanaka et al. ............... 505/220

* cited by examiner

*Primary Examiner* — Stanley Silverman
*Assistant Examiner* — Kallambella Vijayakumar
(74) *Attorney, Agent, or Firm* — Kyle Eppele; Stephen E. Baldwin; Peter A. Lipovsky

(57) ABSTRACT

A layered superconductor device includes multiple layers of a single crystal superconducting material having intermittent layers of superconducting material dispersed in a pattern with a second material such that each layer of the multiple layers a single crystal superconducting material are interconnected via superconducting material, allowing for a continuous current path, and a thickness of the superconducting material never exceeds a first predetermined thickness.

8 Claims, 5 Drawing Sheets

LAYERED SUPERCONDUCTOR DEVICE AND METHOD

CROSS-REFERENCE TO RELATED PATENT APPLICATIONS

This patent application is a division of patent application Ser. No. 12/369,218, filed Feb. 11, 2009, now abandoned, entitled "LAYERED SUPERCONDUCTOR DEVICE AND METHOD" (NC 098,106), which is assigned to the same assignee as the present application, and the details of which are hereby incorporated by reference.

FEDERALLY-SPONSORED RESEARCH AND DEVELOPMENT

This invention is assigned to the United States Government and is available for licensing for commercial purposes. Licensing and technical inquiries may be directed to Office of Research and Technical Applications, Space and Naval Warfare Systems Center, Pacific, Code 2112, San Diego, Calif., 92152; telephone 619-553-2778; email: T2@spawar.navy.mil.

BACKGROUND

Since their discovery, high-temperature superconductors have found a variety of uses in industry. Unfortunately, some high-temperature superconducting materials suffer a number of shortfalls including a limited maximum current capacity, super-conductivity must be limited to a particular direction relative to the crystalline structure of the superconducting material and such crystalline structures tend to lose orientation when grown beyond a thickness $\Delta_c$.

A possible approach to realigning crystal orientation of bulk superconducting devices has been to disperse thin layers of a substrate between layers of the superconducting material in a manner that looks like a layer cake. In such formations, each layer of superconducting material may act as an independent device.

SUMMARY

Various aspects and embodiments of the invention are described in further detail below.

In a first series of embodiments, a superconductor device includes multiple layers of a single crystal superconducting material having intermittent patterned layers of superconducting material dispersed with a second material such that each layer of the single crystal superconducting material is interconnected via superconducting material to allow a continuous current path, and a thickness of the superconducting material never exceeds a first predetermined thickness.

In other embodiments, a superconductor device includes multiple first superconducting means, and second means dispersed between the first superconducting means for assuring that each first superconducting means is interconnected via superconducting material and for causing a continuous thickness of the superconducting material of both the first superconducting means and second means to be less than a first predetermined thickness.

In still other embodiments, a method for forming a superconductor device includes interlacing placing multiple layers a first superconducting material with one or more intermittent patterned layers of the superconducting material and a second material to form an overall structure that assures a single superconducting device having a continuous current path and having an overall thickness of greater than $2\Delta$ but where a thickness of the superconducting material never exceeds $\Delta_c$.

BRIEF DESCRIPTION OF THE DRAWINGS

The features and nature of the present disclosure will become more apparent from the detailed description set forth below when taken in conjunction with the accompanying drawings in which like reference characters identify corresponding like items.

DETAILED DESCRIPTION

The disclosed methods and systems below may be described generally, as well as in terms of specific examples and/or specific embodiments. For instances where references are made to detailed examples and/or embodiments, it should be appreciated that any of the underlying principals described are not to be limited to a single embodiment, but may be expanded for use with any of the other methods and systems described herein as will be understood by one of ordinary skill in the art unless otherwise stated specifically.

Figure 1:
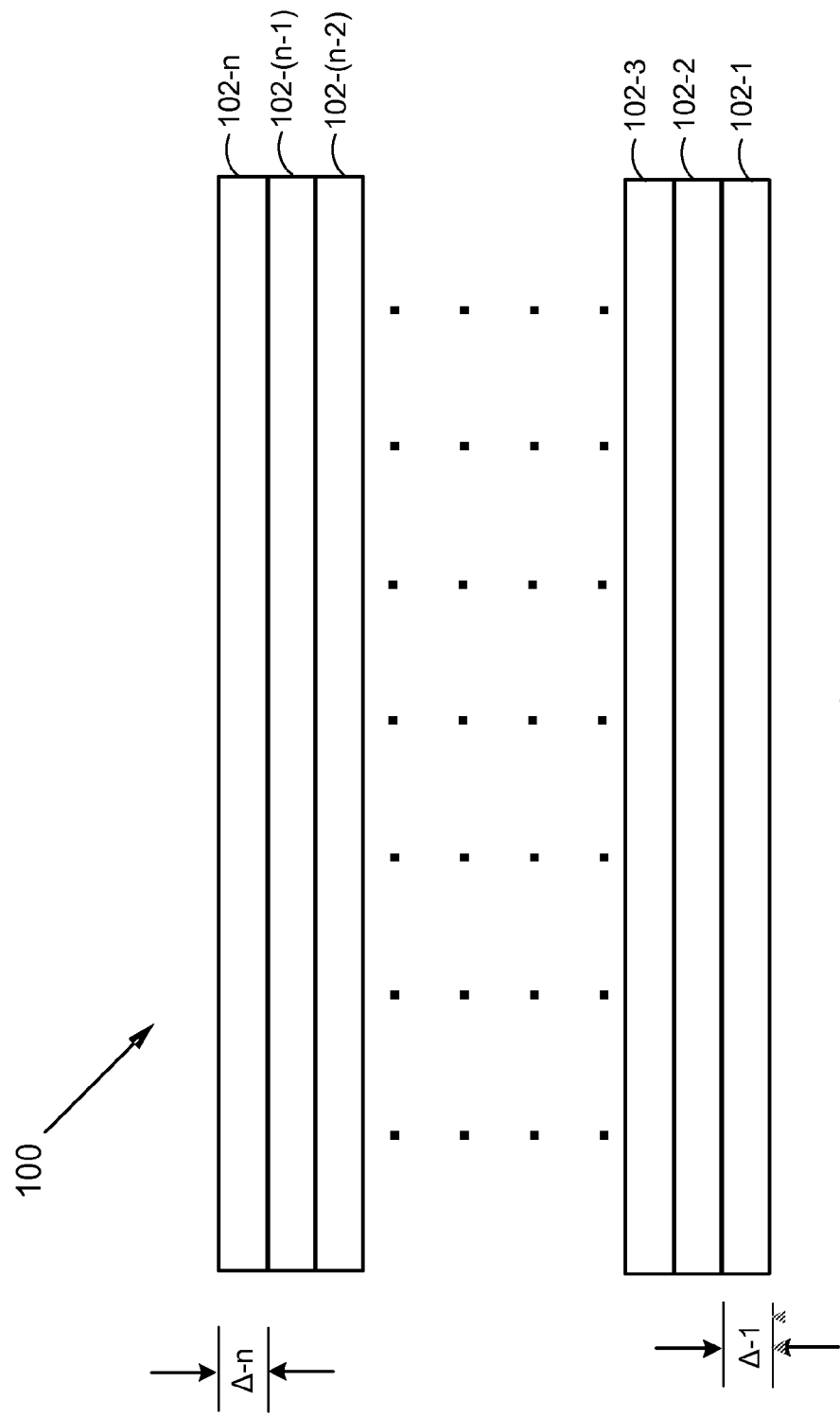
FIG. 1 is a side-view of the layers of an exemplary superconducting device.

FIG. 1 is a side-view of the layers 102-1 . . . 102-n of an exemplary superconducting device 100. As shown in FIG. 1, the various layers 102-1 . . . 102-n can make physical contact with one another, and each of the layers 102-1 . . . 102-n can have a respective thickness $\Delta$-1 . . . $\Delta$-n. While in various embodiments it is envisioned that each layer's thickness $\Delta$-1 . . . $\Delta$-n can be relatively constant, it should also be appreciated that relative layer thicknesses may vary as will be discussed further below. Further, it may be appreciated that patterned layers may be made substantially thinner than layers of superconductor, or conversely make patterned layers may be made substantially thicker than layers of superconductor. Also, a thickness of any type layer may vary to a very small (e.g., a few nanometers) dimension.

Figure 2:
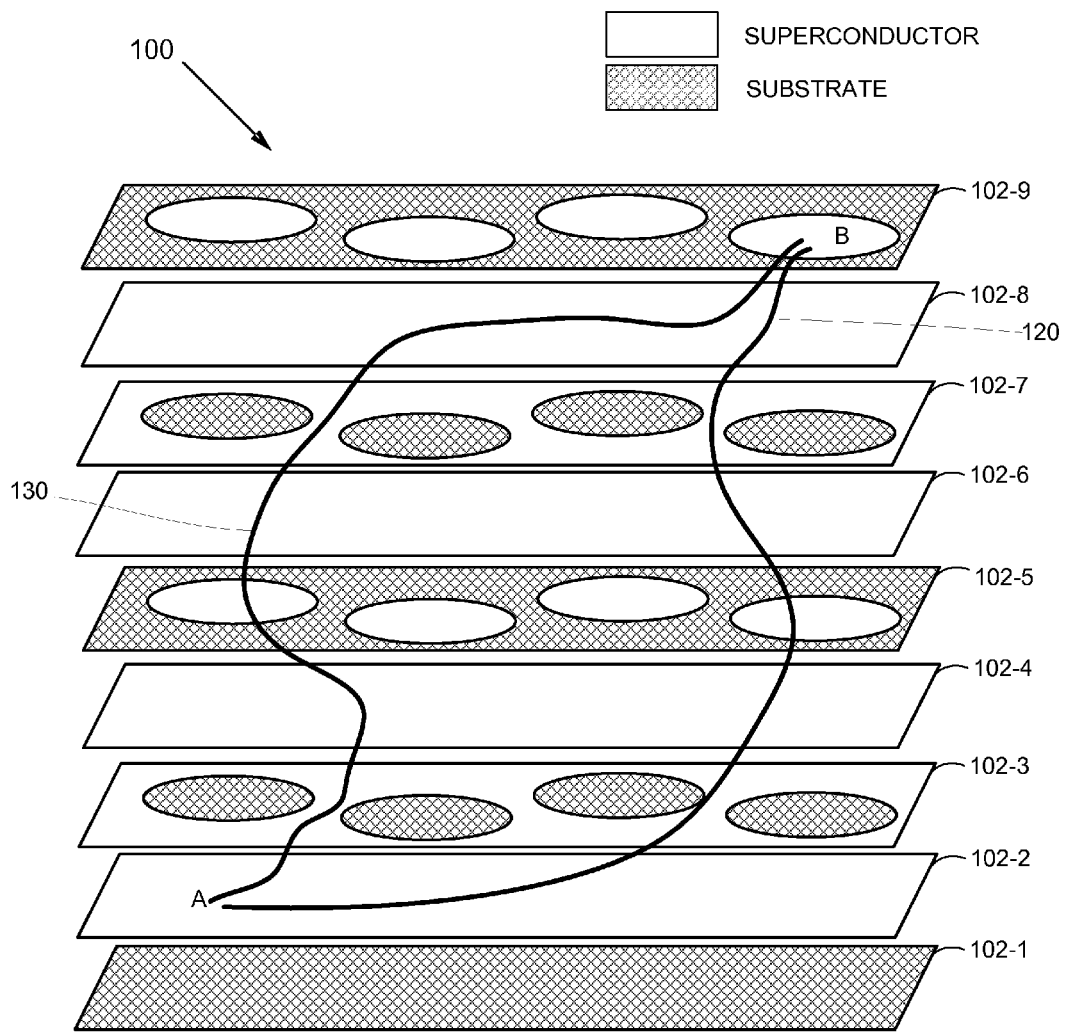
FIG. 2 is an exploded view of the layers of an exemplary superconducting device.

FIG. 2 is an exploded view of the layers of an exemplary superconductor device. As shown in FIG. 2, the various layers 102-1 . . . 102-n can be dispersed according to a particular order of substrate 102-1, superconductor layer 102-2, first patterned layer 102-3, superconductor layer 102-4, second patterned layer 102-5, superconductor layer 102-6, and so on.

Note that the exemplary patterns of the first patterned layer 102-3 (and 102-7) and the second patterned complement layer 102-5 (and 102-9) use patterns of circles dispersed with a second material, e.g., a semiconductor substrate material or a metal, such that the superconductor material portion of the patterned layers could be, for example, somewhere between 30%-70%, and in some embodiments about 50% for each patterned layer.

Also note that while the example of FIG. 2 uses patterns of circles (shown in perspective view in FIG. 2 as oval shape), in various alternatives any other combination of patterns may be used, such as patterns of parallel bars oriented along the direction of desired current flow (which can be a function of crystal orientation), parallel bars oriented perpendicular or parallel to direction of desired current flow, patterns of squares, and so on as may be found advantageous or otherwise suitable from embodiment to embodiment.

As seen in FIG. 2, the superconductor device 100 can provide for alternate continuous current paths 120 or 130 throughout all of the multiple layers 102, from point A to point B.

Figure 3:
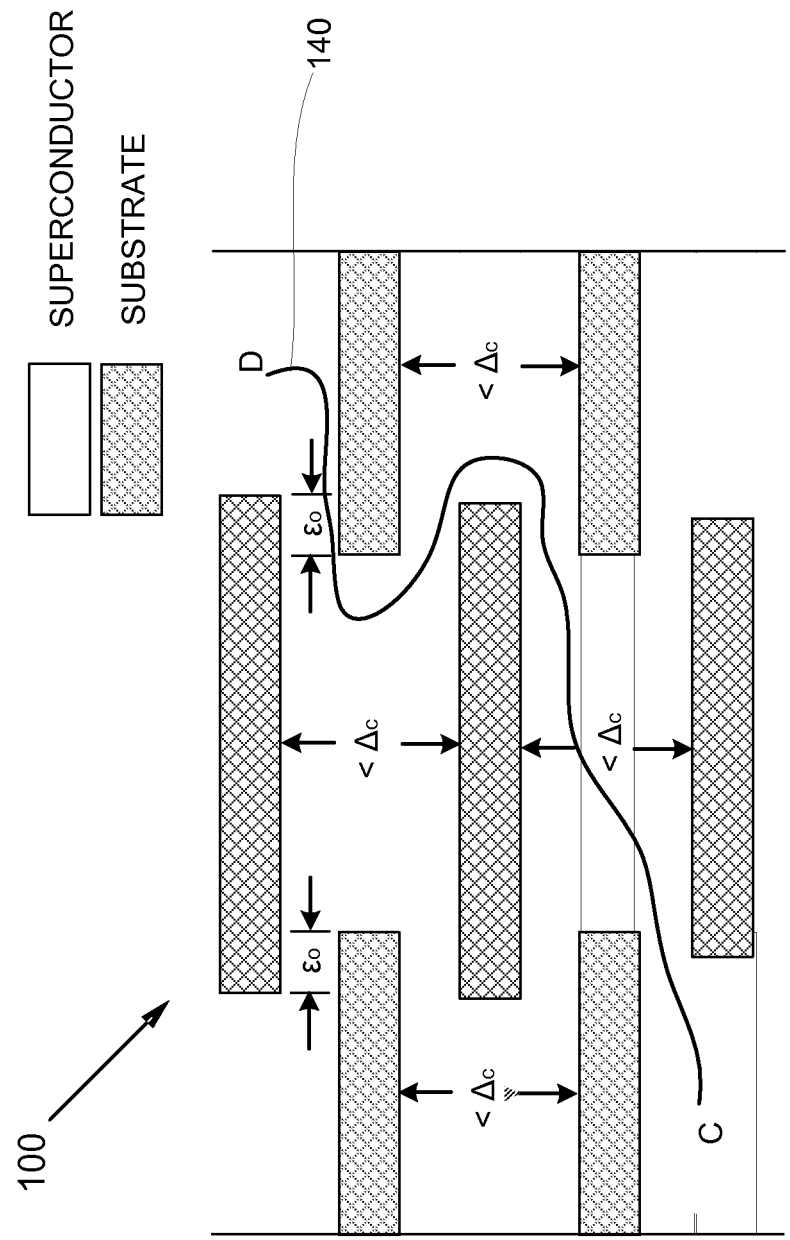
FIG. 3 is a side-view of the layers of an exemplary superconducting device depicting relative geometric relationships.

FIG. 3 is another side-view of a portion of the exemplary superconducting device 100 depicting relative geometric relationships. As shown in FIG. 3, the exemplary superconducting device 100 includes layers of superconducting material dispersed between patterned layers of superconducting material and a second material, which for the present example could be a magnesium oxide (MgO) substrate. The superconductor material could be a high-temperature superconductor (e.g., >30K) such as bismuth-strontium-calcium-copper-oxide (BSCCO) or yttrium-barium-copper-oxide (YBCO). Note that the thickness of the superconducting material in FIG. 3 never exceeds $\Delta_c$, which for the present example represents a thickness in which the superconducting material loses crystal orientation.

Also note that while the exemplary superconducting device 100 has layers of superconducting material and patterned layers of the same general thickness (each approximating one-third of the predetermined thickness in FIG. 3), it should be appreciated that, in various embodiments, it may be advantageous to minimize the thickness of patterned layers so as to increase the amount of superconducting material relative to the second (substrate) material.

Also note that, in various embodiments, it may be beneficial to allow the second material to overlap by some length $\epsilon_o$ depending on the properties of the superconducting material, while in other embodiments no overlap may be desirable. The cross-sectional areas of the patterned layers shown in FIG. 3 are generally rectangular in shape. The general cross-sectional shape could be otherwise, such as trapezoidal, elliptical, or the like.

Figure 4:
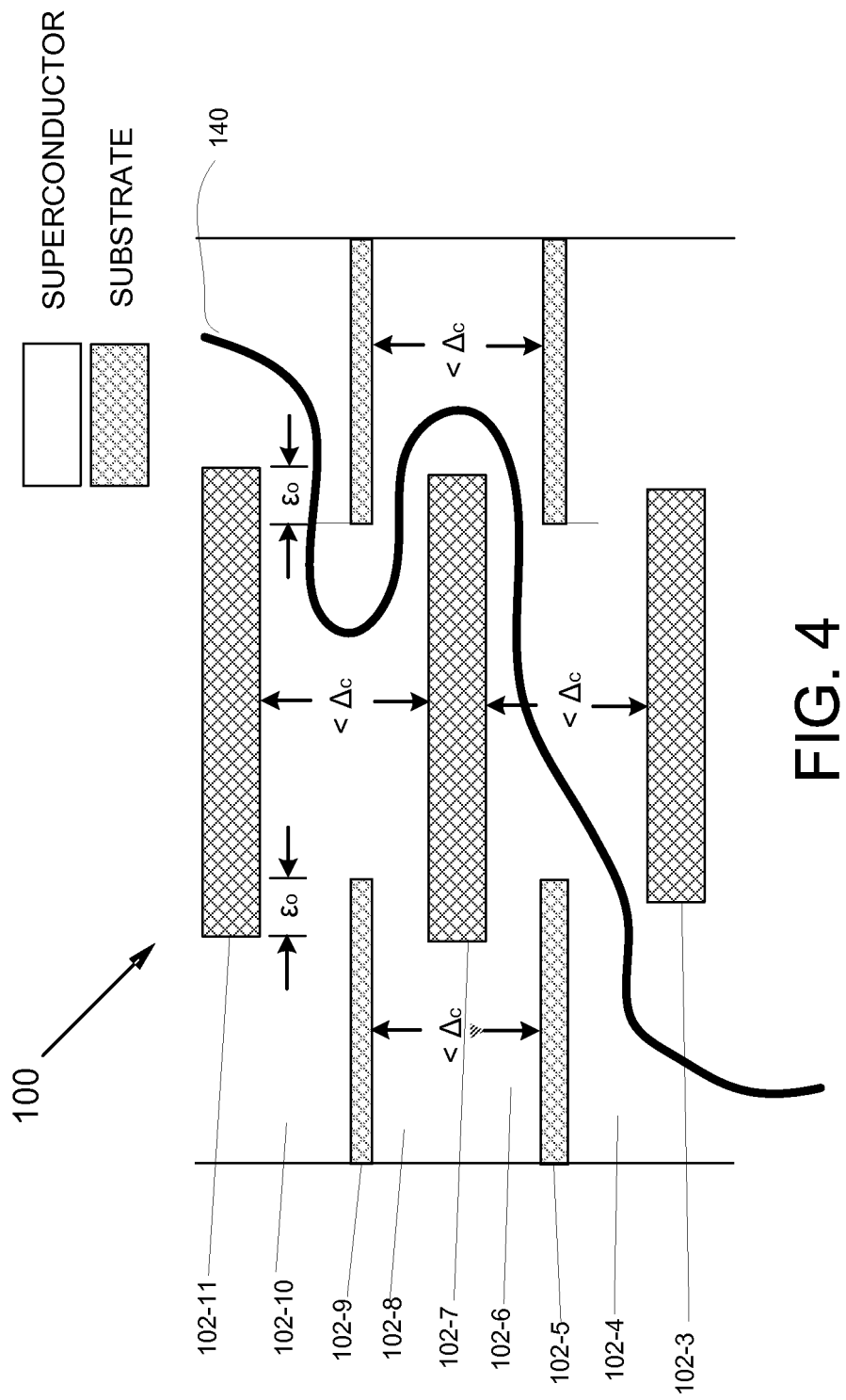
FIG. 4 is another side-view of the layers of an exemplary superconducting device depicting relative geometric relationships.

FIG. 4 shows another view of the superconductor device 100, in which the pattered layers have different depths, while the overall thickness is maintained below the thickness in which the superconductor material might start to lose single crystal orientation. In FIG. 4, the continuous current path 140 through the multiple layers 102 is seen, where the different pattered layers can have different depth dimensions. The patterned layers 102-3, 102-7, and 102-11 differ in depth from patterned layers 102-5 and 102-9. The dimension $\Delta_c$ is always maintained less than or below the depth in which the superconductor material starts to lose single crystal orientation, so as to maintain single crystal orientation throughout the layered device 100.

For instance, it can be seen that the total distance of the gap from the bottom of patterned layer 102-11 to the top of patterned layer 107-7 in FIG. 4 is less than the dimension $\Delta_c$. Similarly, the total distance between the bottom of layer 102-9, layer 102-8, layer 102-7, layer 102-6 and the top of layer 102-5 is also less than the depth or dimension $\Delta_c$, as shown in FIG. 4. The arrangement of the superconductor layers and gaps between the patterned layers shown in FIGS. 2-4 maintains a constant single crystal orientation throughout the device 100, allowing for a continuous current path through each of the layers 102 shown in FIGS. 3-4. Note the continuous current path 140 throughout the multiple layers 102 of the device 100, from point C to point D, while maintaining the constant single crystal orientation (never exceeding the dimension $\Delta_c$).

Figure 5:
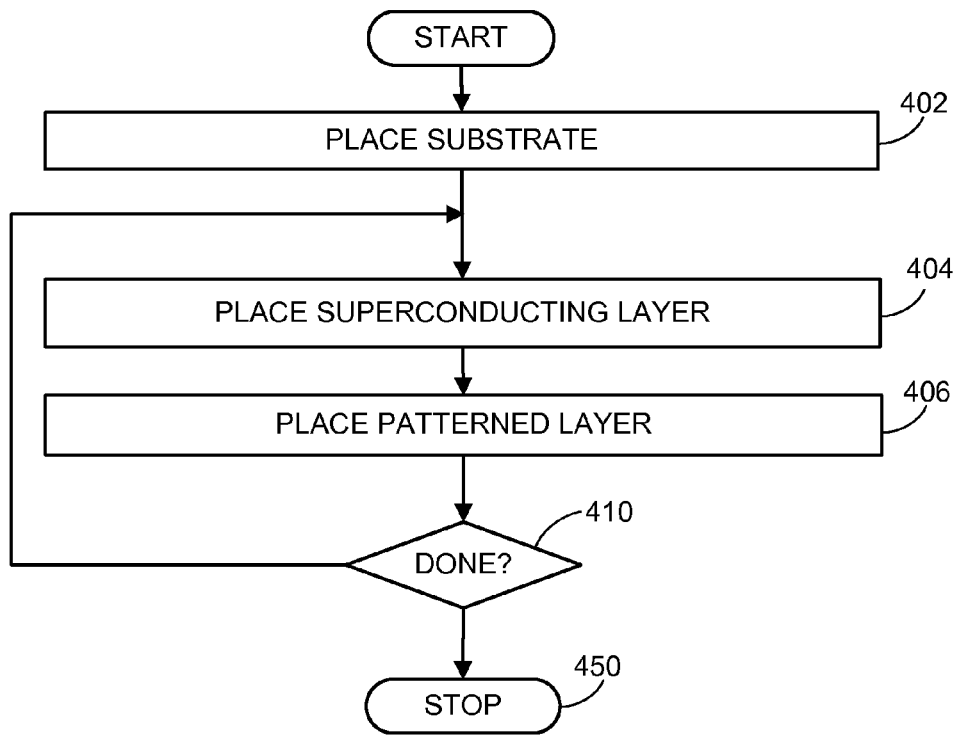
FIG. 5 is a flowchart outlining an exemplary operation of the disclosed methods and systems.

FIG. 5 is a flowchart outlining an exemplary operation of the disclosed methods and systems. The process starts in step 402 where a substrate is provided. Next, in step 404, a layer of superconductor is placed/grown upon the substrate, and then in step 406 a patterned layer is placed/grown upon the superconducting layer. Control continues to step 410.

In step 410, a determination is made as to whether the process of building the overall superconductor device is done. If the process is done, control continues to step 450 there the process stops; otherwise, control jumps back to step 404 where another superconductor layer and another patterned layer are respectively placed/grown noting that it can be beneficial to allow patterned layers to compliment one another in the manner shown in FIGS. 2-4 such that the superconducting material never exceeds a vertical thickness in which the superconducting material loses crystal orientation.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

It will be understood that many additional changes in the details, materials, steps and arrangement of parts, which have been herein described and illustrated to explain the nature of the invention, may be made by those skilled in the art within the principal and scope of the invention as expressed in the appended claims.

What is claimed is:

1. A superconductor device, comprising:
multiple first layered single crystal superconducting means;
second layered means including intermittent patterned layers of a single crystal superconducting material with a second material, the second layered means alternately dispersed between the first layered superconducting means for assuring that each first superconducting means is interconnected via superconducting material to allow at least one continuous current path through the interconnected first layered means and second layered means and for causing a continuous thickness of the superconducting material of both the first layered means and second layered means to be less than a first predetermined thickness wherein the first predetermined thickness is less than a thickness in which the superconducting material loses crystal orientation so as to always maintain single crystal orientation throughout the continuous current path of the superconductor device.

2. The device of claim 1, wherein the first predetermined thickness is $\Delta_c$ which is less than a thickness in which the superconducting material loses crystal orientation.

3. The device of claim 2, wherein the overall thickness of the device is greater than $3\Delta$ but where a thickness of the superconducting material never exceeds $\Delta_c$.

4. The device of claim 2, wherein the overall thickness of the device is greater than $4\Delta$ but where a thickness of the superconducting material never exceeds $\Delta_c$.

5. The device of claim 2, wherein the overall thickness of the respective superconductor layers and the patterned layers is approximately equal.

6. The device of claim 2, wherein the overall thickness of the respective patterned layers is less than the thickness of the superconductor layers.

7. A method for forming a superconductor device, the method comprising:
  alternately interlacing two or more layers of a first single crystal superconducting material with one or more intermittent patterned layers of the single crystal superconducting material and a second material to form an overall structure that assures a single superconducting device to allow at least one continuous current path through the interconnected layers but where a thickness of the superconducting material never exceeds a first predetermined thickness so as to always maintain single crystal orientation throughout the continuous current path of the superconductor device.

8. A superconductor device comprising:
  a first single crystal superconductor material layer;
  a second layer having an intermittent patterned layer of single crystal superconductor material dispersed with a second material;
  a third layer having a complementary intermittent patterned layer of single crystal superconductor material dispersed with the second material where the complementary patterned layer is offset relative to the second patterned layer;
  the first, second and third layers arranged in multiple layers where multiple ones of the first layers are alternately dispersed between the second layers and the third layers to form a layered superconductor device having respective pairs of the second layers and the third layers dispersed apart from one another and where the respective distance between each pair of the second layers and each pair of the third layers never exceeds a first predetermined thickness in which the superconducting material loses crystal orientation so as to always maintain single crystal orientation throughout the device and where each layer of the single crystal superconducting material is interconnected via superconducting material to allow a continuous current path through all of the multiple layers.

* * * * *